US006487674B1

(12) United States Patent
White et al.

(10) Patent No.: US 6,487,674 B1
(45) Date of Patent: Nov. 26, 2002

(54) SINGLE WIRE INTERFACE FOR AN ANALOG TO DIGITAL CONVERTER

(75) Inventors: Joe White, Austin, TX (US); Jerome Johnston, Austin, TX (US); Douglas F. Pastorello, Hudson, NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/521,675

(22) Filed: Mar. 8, 2000

(51) Int. Cl.$^7$ ................................................ G06F 1/04
(52) U.S. Cl. ........................ 713/500; 713/322; 713/600
(58) Field of Search ................................ 713/500, 501, 713/600, 601, 300, 310, 322

(56) References Cited

U.S. PATENT DOCUMENTS

| | | | |
|---|---|---|---|
| 5,508,650 A | * | 4/1996 | Grimm et al. ............... 327/365 |
| 5,719,573 A | | 2/1998 | Leung et al. |
| 5,805,401 A | * | 9/1998 | Schuellein et al. ........... 361/92 |
| 6,167,528 A | * | 12/2000 | Arcoleo ....................... 713/501 |
| 6,314,550 B1 | * | 11/2001 | Wang et al. ................... 716/17 |

OTHER PUBLICATIONS

"Crystal CS5510/11/12/13 16 and 20–Bit, 8–Pin ΔΣ ADC", Cirrus Logic, Inc., Sep. 1999.
"Linear Technology LTC2400 24–Bit μPower ΔΣ0 ADC in SO–8", Linear Technology Corporation, 1998.

* cited by examiner

Primary Examiner—Dennis M. Butler
(74) Attorney, Agent, or Firm—Robert P. Bell; Steven Lin; Dan Shifrin

(57) ABSTRACT

A data clock pin SCLK may be used to receive an SCLK signal as well as sleep and reset signals. During normal operation, the SCLK input pin may receive the SCLK signal, a square wave type clock signal. However, the SCLK signal may also be coupled to a one-shot within the device. When signal SCLK is held high for a predetermined period of time, the one-shot is triggered and a SLEEP signal is generated. The device reacts to this SLEEP signal by entering a sleep mode. Similarly, if the SCLK signal is held low for a predetermined period of time, the one-shot may output a low level RESET signal. This RESET signal resets the device into an initial condition state. Other modes of operation, such as test modes and the like may be entered into by holding the SCLK signal high or low in conjunction with a predetermined logic level on another pin (e.g., VREF).

16 Claims, 3 Drawing Sheets

SINGLE WIRE INTERFACE FOR AN ANALOG TO DIGITAL CONVERTER

CROSS-REFERENCE TO RELATED APPLICATIONS

The subject matter of the present application is related to that in copending U.S. patent application Ser. No. 09/466, 835 filed Dec. 20, 1999, entitled "Techniques for Improving Signal to Noise Ratio in a Digital Filter using Spread Zeros" (Nanda), and copending U.S. patent application Ser. No. 09/596,156, filed concurrently herewith, entitled "Definition of Physical Level of a Logic Output by a Logic Input" (Johnson et al.), both of which are incorporated herein by reference.

FIELD OF THE INVENTION

The present invention relates to the field of semiconductor devices. In particular, the present invention relates to an apparatus for allowing a single pin on a semiconductor device to serve a number of different functions.

BACKGROUND OF THE INVENTION

In semiconductor chip design, it is desirable to reduce the number of input, output, or voltage supply pins in order to reduce package size and reduce cost. It may also be desirable to provide a means for allowing a semiconductor device to enter a "sleep" or static mode in order to reduce power consumption during down periods. For example, such techniques are well known in lap top computers. However, other devices, such as portable medical devices, instruments, and the like, may benefit from the use of a sleep mode in order to reduce power consumption and/or increase battery life.

In addition, it is also useful to be able to send a "reset" command to a device in order to reset the device upon power up or when exiting a sleep mode. It may be useful to use such a reset signal to place all components within the device in an initial condition state such that the device operates properly. Test modes may also be useful to a system debugger as well as a user. If a device can be placed in a test configuration, useful data about the status and operability of the device may be obtained.

For a large device such as a microprocessor or the like, communicating sleep signals may not be as difficult, as a large number of pins are available for such use, or a sleep signal may be input to a data port on the device. However, for smaller devices (e.g., eight pins), such as an A/D converter, the use of extra pins for sleep signals may not be practical.

One alternative is to use a bi-directional data port to receive sleep signals as well as output data. For example, Cirrus Logic model 5525/5526 A/D converters may utilize a bi-directional data pins to output serial data as well as receive input data. A sleep signal may be sent to such-a pin as a data signal which may be interpreted by the device as a sleep command. Such a command may then be processed and the device placed in a sleep state.

However, not all such devices may be provided with a bi-directional data port. Moreover, not all such devices may be provided with circuitry necessary to interpret input commands and process them as sleep commands. In addition, a device outputting data through a serial port cannot receive such a sleep command until the data being output is completed. Thus, a requirement remains in the art for a technique sending sleep or resent commands without the use of an extra data pin or bi-directional data port.

SUMMARY OF THE INVENTION

The present invention provides a method and apparatus to allow a semiconductor device to utilize one signal pin for a number of different functions. In the preferred embodiment of the present invention, a data clock pin SCLK may be used to receive an SCLK signal as well as sleep and reset signals.

During normal operation, the SCLK input pin may receive the SCLK signal, a square wave type clock signal. However, the SCLK signal may also be coupled to a one-shot within the device. When signal SCLK is held high for a predetermined period of time, the one-shot is triggered and a SLEEP signal is generated. The device reacts to this SLEEP signal by entering a sleep mode.

Additionally, once the SCLK signal is taken low, the one-shot may output a RESET signal. This RESET signal resets the device into an initial condition state.

Other modes of operation, such as test modes and the like may be entered into by holding the SCLK signal high or low in conjunction with a predetermined logic level on another pin (e.g., VREF).

DETAILED DESCRIPTION OF THE INVENTION

Figure 1:
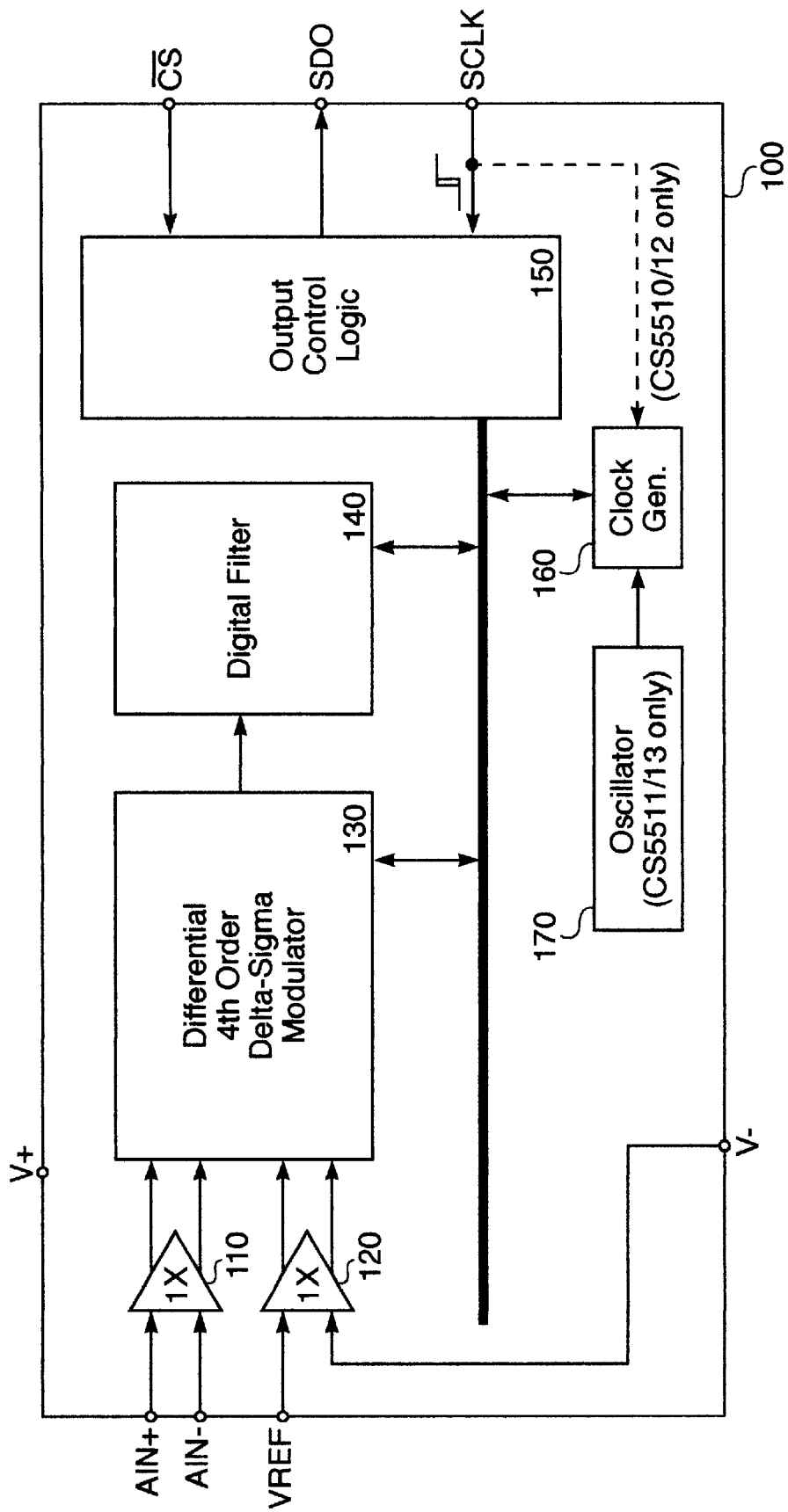
FIG. 1 is a block diagram of a single channel differential input analog-to-digital converter.

FIG. 1 is a block diagram of a single channel differential input analog-to-digital converter 100. In the diagram of FIG. 1, the rectangular border represents the boundary of the chip, while the white circles on that border represent input, output, or supply pins for the chip.

Both the analog differential signal inputs AIN− and AIN+ as well as reference input VREF are buffered through respective buffers 110 and 120 to reduce input current requirements. The analog outputs of buffers 110 and 120 are fed to a differential 4th order delta-sigma modulator 130 which converts the analog input to produce a digital data stream to digital filter 140. Such delta-sigma modulators are discussed, for example, in Leung et al., U.S. Pat. No. 5,719,573, incorporated herein by reference.

Digital filter 140 may comprise, for example, a spread zero filter to convert single bits to a multiple bit representation, reducing the word rate in the process. An example of such a spread zero filter is disclosed, for example, in copending application Ser. No. 08/466,835 entitled "Techniques for Improving Signal to Noise Ratio in a Digital Filter using Spread Zeros" (Nanda) filed on Dec. 20, 1999 and incorporated herein by reference.

Output from digital filter 140 may then be fed to output control logic 150. Output control logic 150 outputs digital data through a simple serial output line SDO in response to chip select signal $\overline{CS}$. When chip select signal $\overline{CS}$ goes low, output control logic 150 outputs digital data. When signal $\overline{CS}$ goes high, the output SDO is tri-stated.

Depending upon application, either SCLK, $\overline{CS}$ or a combination of signals may be used to control data output. For example, in some applications, signal $\overline{CS}$ may be held low, enabling the chip at all times and data output controlled by activating or deactivating signal SCLK. In other applications (particularly where signal SCLK is used as a system source clock) signal SCLK may be continually activated and data flow controlled by toggling signal $\overline{CS}$. In yet other applications, control of both signals $\overline{CS}$ and SCLK may be used to control data flow from single channel differential input analog-to-digital converter 100.

Signal SCLK is a clock signal used to shift data out from output control logic 150. Clock generator 160 may be used to generate a clock signal for single channel differential input analog-to-digital converter 100 based upon either a signal from oscillator 170 or from signal SCLK. This internal clock signal may be used, for example, to clock differential 4$^{th}$ order delta-sigma modulator 130, as well as clocking data within the device.

As illustrated in FIG. 1, oscillator 170 may be used as a source clock signal in one version of single channel differential input analog-to-digital converter 100 (e.g., part numbers CS5511/13) whereas SCLK may be used as a source clock signal in another version of single channel differential input analog-to-digital converter 100 (e.g., part numbers CS5510/12). Different versions of the same chip may be enabled as a so-called bond-wire option. The actual semiconductor chip for all four parts (CS5510/11/12/13) may be substantially or completely identical. However, depending on how the chip is wire-bonded to the die (packaging) may determine whether the resultant device uses SCLK or internal oscillator 170 as a clock source. A corresponding pad within the chip may be tied to supply voltage or ground to enable one mode or the other.

In the Prior Art, signal SCLK is generally used as a non-continuous clock. That is to say that signal SCLK was typically used only to clock data out of a device. However, in one embodiment of the present invention, signal SCLK may serve a dual purpose, as both data clocking signal and also as a source for internal clock generator 160.

Internal clock generator 160 may be used to multiplex and control the clock signal to produce clock signals for the various component within single channel differential input analog-to-digital converter 100. Internal clock generator 160 may control phase between various clock signals and the like.

Signal SCLK may be used as a reset signal to single channel differential input analog-to-digital converter 100, and may also be used to initiate a sleep mode. If signal SCLK is held high for a predetermined amount of time, output control logic recognizes this as a sleep signal and places single channel differential input analog-to-digital converter 100 in a sleep mode.

Figure 3:
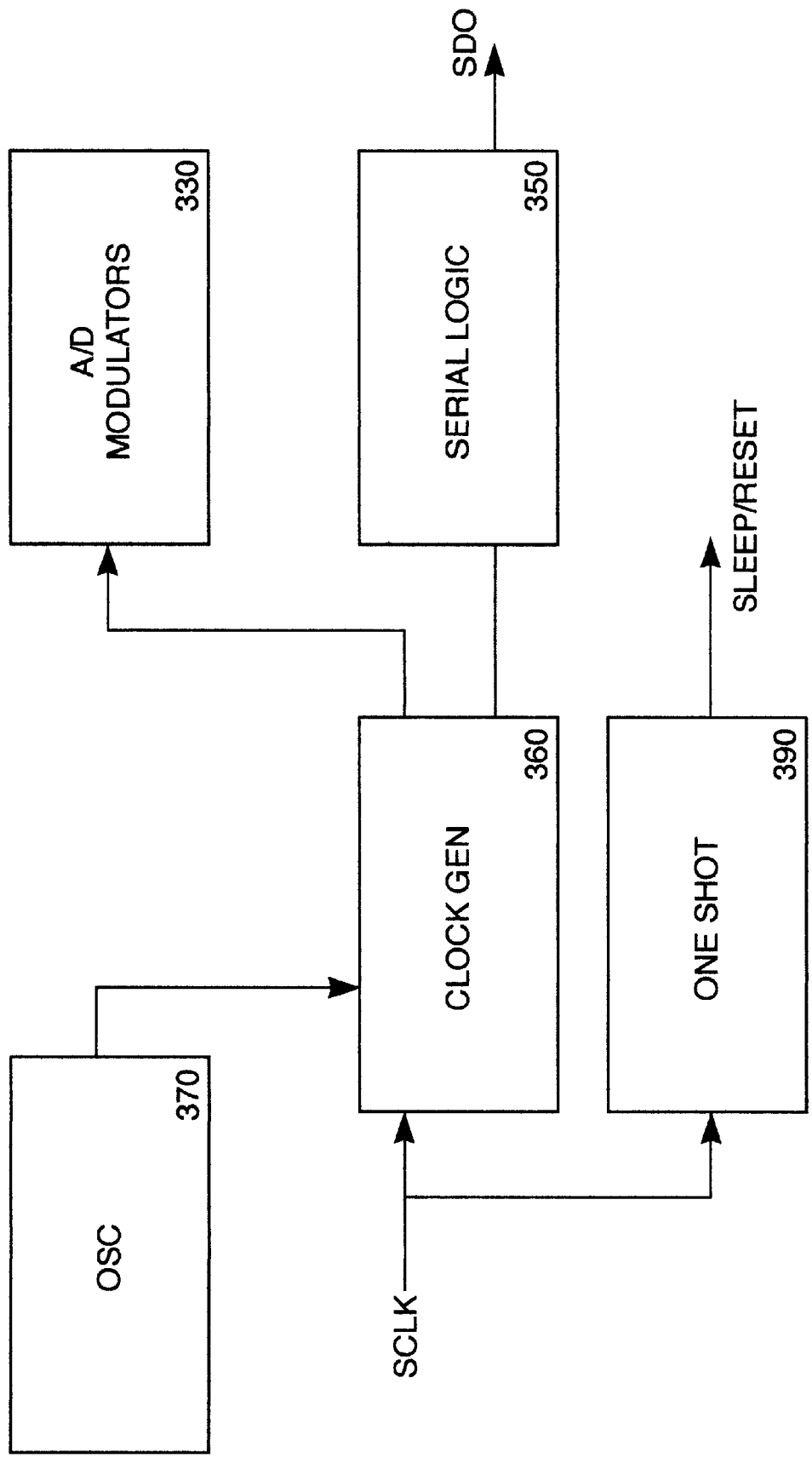
FIG. 3 is a simplified block diagram of one embodiment of the single channel differential input analog-to-digital converter of FIG. 1.

FIG. 3 is a simplified block diagram of one embodiment of the single channel differential input analog-to-digital converter of FIG. 1. The diagram of FIG. 3 include components from the block diagram of FIG. 1, and also includes additional components specific to this embodiment. For the purposes of illustration, similar components are given similar reference numerals (e.g., oscillator 170 of FIG. 1 is analogous to oscillator 370 of FIG. 3).

Oscillator 370 generates a clock signal which is fed to clock generator circuit 360. Clock generator circuit 360 may also receive signal SCLK as illustrated in FIG. 3. For the purposes of illustration, the embodiment of FIG. 3 is shown using an internal oscillator to generate some clock signals. However, as noted above, an alternative embodiment may utilize signal SCLK for both clock source (in place of oscillator 370) as well as a data clocking signal.

Clock generator circuit 360 generates clock signals for A/D modulators 330 as well as serial output logic 350 in a similar manner as discussed with regard to FIG. 1. Serial output logic 350 may then generate serial output data SDO, again, in a manner similar to that illustrated in FIG. 1.

Figure 2:
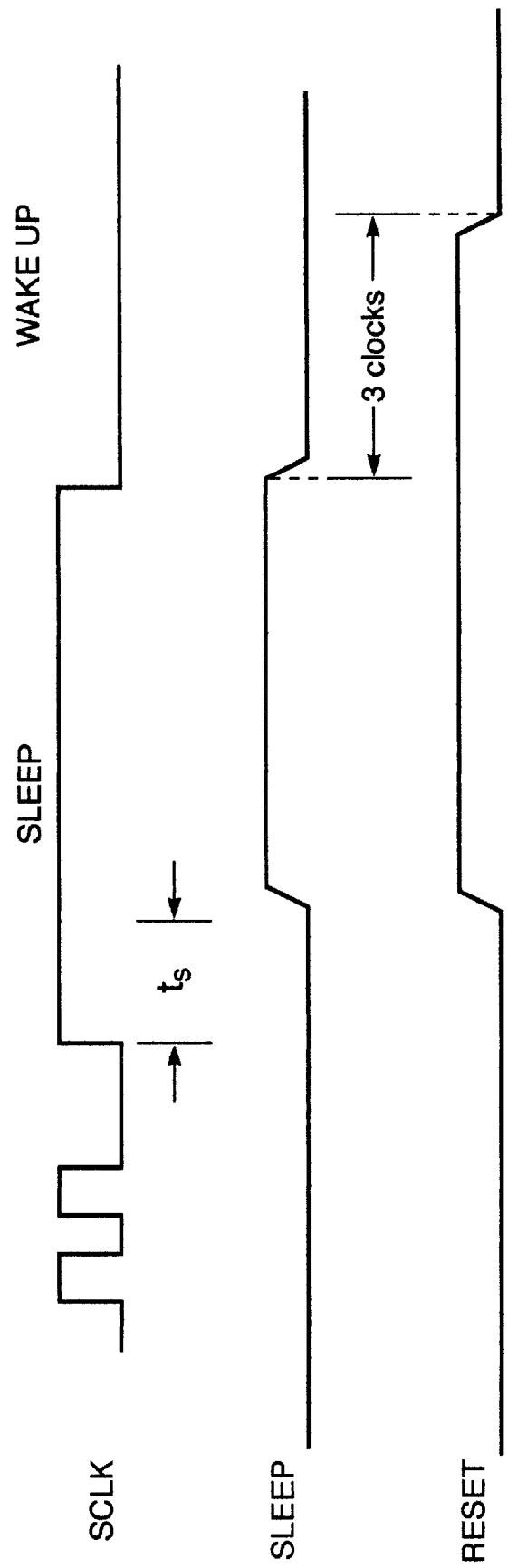
FIG. 2 is a waveform diagram illustrating how the SCLK signal may be use to generate a sleep mode.

However, in addition, signal SCLK may also be fed to a one-shot circuit 390 to generate a sleep and/or reset signal. FIG. 2 is a waveform diagram illustrating how the SCLK signal may be used to generate a sleep mode. As illustrated in FIG. 2, signal SCLK may take on the form of a square wave form (clock signal) when clocking out data SDO. However, when it is desired to enter a sleep mode (e.g., to conserve power during downtime), signal SCLK may be held high during the sleep period.

One-shot 390 of FIG. 3 maybe continually reset by signal SCLK when it goes low. However, if signal SCLK goes high for a predetermined period, one-shot 390 may output a sleep signal SLEEP as illustrated in FIG. 2. Signal SLEEP may be triggered by one-shot 390 when signal SCLK is held high for at least a predetermined period $t_s$. In the preferred embodiment, $t_s$ may be within the range of 250 microseconds to 2 milliseconds. Other values to $t_s$ may be used, provided that the value of $t_s$ exceeds at least one full clock cycle.

Once time period $t_s$ has elapsed, sleep signal SLEEP may be output. Signal SLEEP may go high for as long as it is desired to maintain the device in a sleep state. For the purposes of illustration, in FIG. 3, the signals SLEEP and RESET are shown as one signal line. However, as one of ordinary skill in the art may appreciate, these signals may be separate and distinct. In the alternative, a combined SLEEP/RESET signal may be used to indicate when the device should be in sleep mode (high) or reset (low).

Although not illustrated in FIG. 3, signal SLEEP may be fed to one or more blocks within FIG. 3 (or FIG. 1) to cause the device to enter a sleep state. High current consuming devices such as the A/D modulators 330 may be shut down using a number of techniques. For example, clock signals from clock generator 360 may be suppressed during the sleep period to effectively shut down digital portions of the circuit. Analog portions of the circuit, which represent the bulk of power consumption in the device, may be shut down by suppressing bias and reference voltages to analog circuitry.

When it is desired to reset (awake) the device, signal SCLK may be taken low. The RESET signal will be active for the next 3 clock cycles.

Note that although illustrated as a single one-shot 390 in FIG. 3, a number of one-shots or other equivalent digital or analog circuitry may be utilized to achieve the functionality illustrated in FIG. 2. In the preferred embodiment of the present invention, one-shot 390 may comprise one or more capacitors which may charge or discharge based on SCLK. When signal SCLK oscillates as a clock signal, the capacitor remains at a steady state. When signal SCLK goes high for a predetermined period, the capacitor charges up to a predetermined voltage level and outputs a high logic signal. Similarly, when signal SCLK goes low, the capacitor will discharge after a predetermined period and output a low level logic signal.

Signal SCLK may also be used to cause the device to enter one or more test modes. Signal SCLK may be held high for a predetermined time period (as in sleep mode) while another pin, such as VREF is held to a predetermined level (e.g., zero).

While the preferred embodiment and various alternative embodiments of the invention have been disclosed and described in detail herein, it may be apparent to those skilled in the art that various changes in form and detail may be made therein without departing from the spirit and scope thereof.

We claim:

1. An integrated circuit, comprising:
   a first input signal pin for receiving a clock signal from an external circuit coupled to the integrated circuit during at least a first interval;
   a clock circuit, coupled to the first input signal pin, for receiving the clock signal and utilizing the clock signal in the integrated circuit during at least the first interval;
   a one-shot circuit, coupled to the first input signal pin, for receiving the clock signal during at least first interval and resetting the one-shot circuit when the clock signal is received, said one-shot circuit outputting a first signal after a first predetermined time period after the clock signal is not received during at least a second interval.

2. The integrated circuit of claim 1, wherein said one-shot circuit outputs the first signal after the first predetermined time period after the clock signal is not received during the at least second interval when said first input signal pin receives a first logic level signal for at least the first predetermined time period during the at least second interval.

3. The integrated circuit of claim 2, wherein said one-shot circuit outputs a second signal after a second predetermined time period after the clock signal is not received during at least a third interval when said first input signal pin receives a second logic level signal for at least the second predetermined time period during the at least third interval.

4. The integrated circuit of claim 3, wherein said first signal is a sleep signal commanding the integrated circuit to enter a sleep mode.

5. The integrated circuit of claim 4, wherein the second signal is a reset signal commanding the integrated circuit to enter a reset mode.

6. The integrated circuit of claim 5 wherein the clock signal comprises a data clock signal for clocking data out of the integrated circuit.

7. The integrated circuit of claim 4, further comprising:
   a second signal input pin for receiving a signal for the integrated circuit;
   wherein said one-shot circuit outputs a third signal after the first predetermined time period after the clock signal is not received during at least a fourth interval when said first input signal pin receives a first logic level signal for at least the first predetermined time period during the at least fourth interval and the second signal input pin receives a logic signal of predetermined level during the at least fourth interval.

8. The integrated circuit of claim 7, wherein the third signal is a test signal commanding the integrated circuit to enter a test mode.

9. A method of controlling an integrated circuit, comprising the steps of:
   receiving, in a first input signal pin, a clock signal from an external circuit coupled to the integrated circuit during at least a first interval,
   receiving in a clock circuit, coupled to the first input signal pin, the clock signal,
   utilizing the clock signal in the integrated circuit during at least the first interval,
   receiving, in a one-shot circuit, coupled to the first input signal pin, the clock signal during at least first interval
   resetting the one-shot circuit when the clock signal is received, and
   outputting from the one-shot circuit, a first signal after a first predetermined time period after the clock signal is not received during at least a second interval.

10. The method of claim 9, wherein said outputting step further comprises the step of:
    outputting from the one-shot circuit, the first signal after the first predetermined time period after the clock signal is not received during the at least second interval when the first input signal pin receives a first logic level signal for at least the first predetermined time period during the at least second interval.

11. The method of claim 10, further comprising the step of:
    outputting from the one-shot circuit, a second signal after a second predetermined time period after the clock signal is not received during at least a third interval when the first input signal pin receives a second logic level signal for at least the second predetermined time period during the at least third interval.

12. The method of claim 11, further comprising the step of placing the integrated circuit in a sleep mode in response to the first signal.

13. The method of claim 12, further comprising the step of resetting the integrated circuit in response to the second signal.

14. The method of claim 13 wherein said step of utilizing the clock signal comprises the step of using the clock signal as data clock signal for clocking data out of the integrated circuit.

15. The method of claim 14, further comprising the steps of:
    receiving, in a second signal input pin, a signal for the integrated circuit,
    outputting, from the one-shot circuit, a third signal after the first predetermined time period after the clock signal is not received during at least a fourth interval when the first input signal pin receives a first logic level signal for at least the first predetermined time period during the at least fourth interval and the second signal input pin receives a logic signal of predetermined level during the at least fourth interval.

16. The method of claim 15, further comprising the step of placing the integrated circuit in a test mode in response to the third signal.

* * * * *